(12) United States Patent
Hwang

(10) Patent No.: US 10,573,380 B2
(45) Date of Patent: Feb. 25, 2020

(54) MEMORY DEVICE AND OPERATING METHOD THEREOF

(71) Applicant: SK hynix Inc., Gyeonggi-do (KR)

(72) Inventor: Nam Oh Hwang, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 1 day.

(21) Appl. No.: 15/961,210

(22) Filed: Apr. 24, 2018

(65) Prior Publication Data

US 2019/0080752 A1 Mar. 14, 2019

(30) Foreign Application Priority Data

Sep. 13, 2017 (KR) .......................... 10-2017-0116943

(51) Int. Cl.
| | | |
|---|---|---|
| *G11C 11/34* | (2006.01) | |
| *G11C 11/56* | (2006.01) | |
| *G11C 16/26* | (2006.01) | |
| *G11C 16/28* | (2006.01) | |
| G11C 16/04 | (2006.01) | |
| G11C 29/02 | (2006.01) | |

(52) U.S. Cl.
CPC ...... *G11C 11/5671* (2013.01); *G11C 11/5642* (2013.01); *G11C 16/26* (2013.01); *G11C 16/28* (2013.01); *G11C 16/0483* (2013.01); *G11C 29/021* (2013.01); *G11C 29/028* (2013.01); *G11C 2211/5631* (2013.01); *G11C 2211/5644* (2013.01)

(58) Field of Classification Search
CPC . G11C 16/3403; G11C 16/3409; G11C 16/10; G11C 14/3635
USPC ...................................................... 365/185.3
See application file for complete search history.

(56) References Cited

U.S. PATENT DOCUMENTS

| | | | |
|---|---|---|---|
| 7,613,045 B2 | 11/2009 | Murin et al. | |
| 10,229,749 B2* | 3/2019 | Oh ......................... | G11C 16/10 |
| 2011/0019493 A1* | 1/2011 | Ikeda ..................... | G11C 7/065 |
| | | | 365/203 |
| 2015/0043282 A1* | 2/2015 | Shin ................... | G11C 16/3495 |
| | | | 365/185.21 |

FOREIGN PATENT DOCUMENTS

KR 1020140014547 2/2014

* cited by examiner

*Primary Examiner* — Hoai V Ho
*Assistant Examiner* — Minh Dinh
(74) *Attorney, Agent, or Firm* — IP & T Group LLP

(57) ABSTRACT

There are provided a memory system and an operating method thereof. A memory system includes: a memory device configured to generate first read voltages and second read voltages, based on initial read voltages and first and second offset voltages, in response to a user read command, and output first data and second data, which are acquired by performing read operations on multi-bit memory cells, based on the first read voltages and the second read voltages; and a memory controller configured to output the user read command, wherein the memory controller includes a state counter configured to count numbers of data bits respectively corresponding to a plurality of threshold voltage states from the first data and the second data, and extract numbers of memory cells respectively included in a plurality of threshold voltage regions divided by the first read voltages and the second read voltages by calculating the counted result.

18 Claims, 11 Drawing Sheets

FIG. 10

Loop 1:
   Step 1. read LSB/MSB at −100 mv offset @R1, R2, R3
   Step 2. count a number of memory cells of each threshold voltage state MSB page : 1001 0010 1010 0111 0001
LSB page : 0101 1000 1101 1001 1010

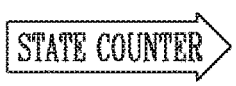 STATE COUNTER ⇒

| State | 11 | 10 | 00 | 01 |
|---|---|---|---|---|
| Count | 3 | 6 | 4 | 7 |

Loop 2:
   Step 1. read LSB/MSB at −80 mv offset @R1, R2, R3
   Step 2. count a number of memory cells of each threshold voltage state MSB page : 1011 0010 1010 0111 0001
LSB page : 1101 1000 1101 1011 0010

 STATE COUNTER ⇒

| State | 11 | 10 | 00 | 01 |
|---|---|---|---|---|
| Count | 5 | 5 | 4 | 6 |

FIG. 11

−100mv @ R1, R2, R3 on-cell count at R1' = 3
on-cell count at R2' = 3 + 6 = 9
on-cell count at R3' = 3 + 6 + 4 = 13

| State | 11 | 10 | 00 | 01 |
|---|---|---|---|---|
| Count | 3 | 6 | 4 | 7 |

−80mv @ R1, R2, R3 on-cell count at R1" = 5
on-cell count at R2" = 5 + 5 = 10
on-cell count at R3" = 5 + 5 + 4 = 14

| State | 11 | 10 | 00 | 01 |
|---|---|---|---|---|
| Count | 5 | 5 | 4 | 6 |

MEMORY DEVICE AND OPERATING METHOD THEREOF

CROSS-REFERENCE TO RELATED APPLICATION

The present application claims priority under 35 U.S.C. § 119(a) to Korean patent application number 10-2017-0116943, filed on Sep. 13, 2017, which is incorporated herein by reference in its entirety.

BACKGROUND

1. Field

Various embodiments of the present disclosure generally relate to a memory device. Particularly, the embodiments relate to a memory device capable of extracting a threshold voltage distribution of memory cells and an operating method thereof.

2. Description of the Related Art

A memory device may include a plurality of memory cells coupled to one word line, and each of the memory cells may be coupled to a page buffer through a bit line. A read operation may be performed, which senses and temporarily stores data stored in the memory cells, using such page buffers, and outputs the stored data.

A threshold voltage distribution of the memory cells may be further widened as time passes after a program operation is performed. As the threshold voltage distribution of the memory cells is widened, the reliability of the read operation may deteriorate. Thus, a technique for extracting a threshold voltage distribution of memory cells is needed.

SUMMARY

Embodiments provide a memory device with improved reliability and an operating method thereof.

According to an aspect of the present disclosure, there is provided a memory system including: a memory device configured to generate first read voltages and second read voltages, based on initial read voltages and first and second offset voltages, in response to a user read command, and output first data and second data, which are acquired by performing read operations on multi-bit memory cells, based on the first read voltages and the second read voltages; and a memory controller configured to output the user read command, wherein the memory controller includes a state counter configured to count numbers of data bits respectively corresponding to a plurality of threshold voltage states from the first data and the second data, and extract numbers of memory cells respectively included in a plurality of threshold voltage regions divided by the first read voltages and the second read voltages by calculating the counted result.

According to an aspect of the present disclosure, there is provided a memory system including: a memory device; and a memory controller, wherein the memory device includes: multi-bit memory cells; an input/output circuit configured to receive a user read command from the memory controller; a voltage generating circuit configured to generate first read voltages, based on initial read voltages and a first offset voltage, and generate second read voltages, based on the initial read voltages and a second offset voltage, in response to the user read command; and a page buffer group config- ured to store first data acquired by performing a first MSB read operation and a first LSB read operation on the multi-bit memory cells, based on the first read voltages, and store second data acquired by performing a second MSB read operation and a second LSB read operation on the multi-bit memory cells, based on the second read voltages, wherein the memory controller includes a state counter configured to derive a first addition result by adding number of data bits respectively corresponding to a plurality of threshold voltage states from the first data, derive a second addition result by adding number of data bits respectively corresponding to a plurality of threshold voltage states from the second data, and extract a number of memory cells included in any one of a plurality of threshold voltage regions divided by the first read voltages and the second read voltages, based on a result obtained by subtracting the second addition result from the first addition result.

According to an aspect of the present disclosure, there is provided a method for operating a memory system, the method including: receiving a first user read command; reading first data through read operations on a plurality of memory cells, using first read voltages, in response to the user read command; receiving a second user read command and a first offset voltage; reading second data through the read operations on the plurality of memory cells, using second read voltages generated based on the first read voltages and the first offset voltage, in response to the second user read command; and extracting a number of memory cells included in a first region among a plurality of threshold voltage regions divided by the first read voltages and the second read voltages by subtracting a number of data bits corresponding a first threshold voltage state, which is extracted from the second data, from a number of data bits corresponding to the first threshold voltage state, which is extracted from the first data.

BRIEF DESCRIPTION OF THE DRAWINGS

Various embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIGS. 9 to 12 are diagrams illustrating an operation of extracting a threshold voltage distribution according to an embodiment of the present disclosure.

DETAILED DESCRIPTION

Various embodiments of the present invention are described below in more detail with reference to the accompanying drawings. We note, however, that the present invention may be embodied in different forms and variations, and should not be construed as being limited to the embodiments set forth herein. Rather, the described embodiments are provided so that this disclosure will be thorough and complete, and will fully convey the present invention to those skilled in the art to which this invention pertains.

The drawings are not necessarily to scale and, in some instances, proportions may have been exaggerated in order to clearly illustrate features of the embodiments.

The terminology used herein is for the purpose of describing particular embodiments only and is not intended to be limiting of the present invention.

In the entire specification, when an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

Hereinafter, the various embodiments of the present invention will be described in detail with reference to the attached drawings.

Figure 1:
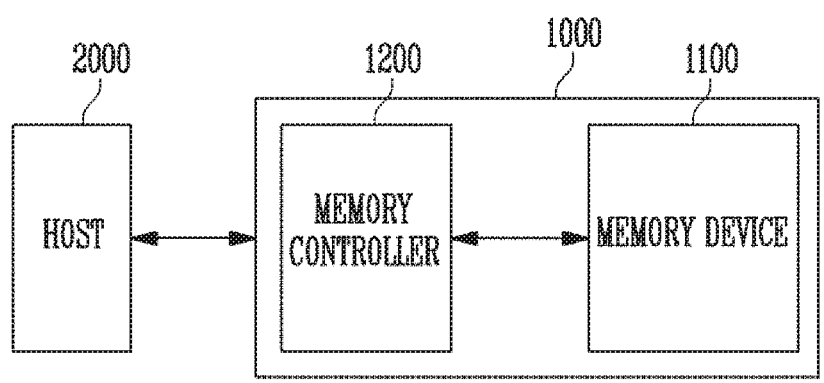
FIG. 1 is a diagram illustrating a memory system according to an embodiment of the present disclosure.

FIG. 1 is a diagram illustrating a memory system 1000 according to an embodiment of the present disclosure.

Referring to FIG. 1, the memory system 1000 may include a memory device 1100 that stores data and a memory controller 1200 that controls the memory device 1100 under the control of a host 2000.

The host 2000 may communicate with the memory system 1000 by using an interface protocol such as peripheral component interconnect-express (PCI-E), advanced technology attachment (ATA), serial ATA (SATA), parallel ATA (PATA), or serial attached SCSI (SAS). In addition, Interface protocols between the host 2000 and the memory system 1000 are not limited to the above-described examples, and may be one of other interface protocols such as a universal serial bus (USB), a multi-media card (MMC), an enhanced small disk interface (ESDI), and integrated drive electronics (IDE).

The memory controller 1200 may control overall operations of the memory system 1000, and control data exchange between the host 2000 and the memory device 1100. For example, the memory controller 1200 may program or read data by controlling the memory device 1100 in response to a request of the host 2000. Also, the memory controller 1200 may store information main memory blocks and sub-memory blocks, which are included in the memory device 1100, and select the memory device 1100 such that perform a program operation on a main memory block or a sub-memory block according to the amount of data loaded for the program operation. In some embodiments, the memory device 1100 may include a double data rate synchronous dynamic random access memory (DDR SDRAM), a low power double data rate 4 (LPDDR4) SDRAM, a graphics double data rate (GDDR) SRAM, a low power DDR (LPDDR), a rambus dynamic random access memory (RDRAM), and a flash memory.

The memory device 1100 may perform a program, read, or erase operation under the control of the memory controller 1200.

Figure 2:
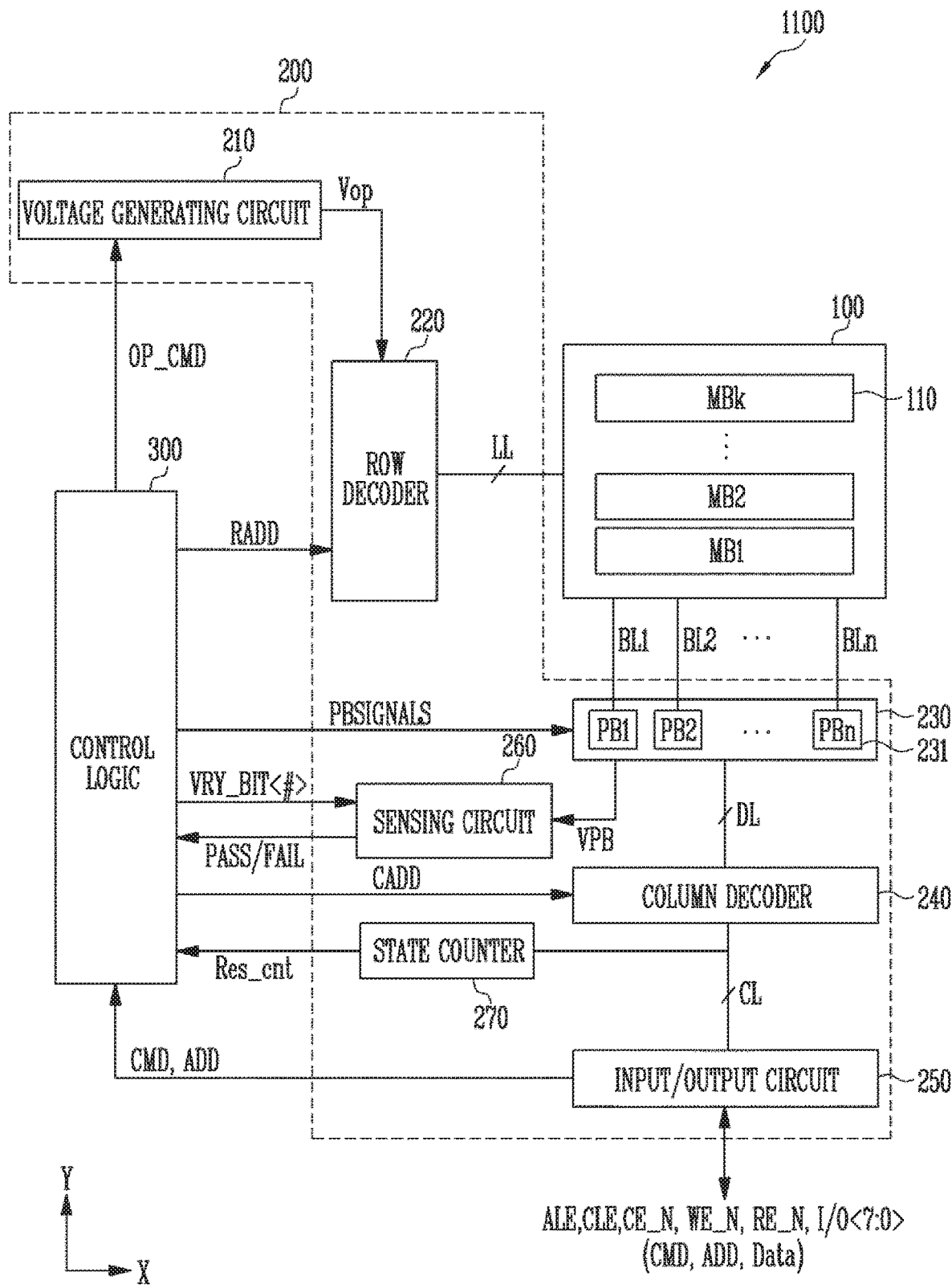
FIG. 2 is a diagram illustrating a memory device of FIG. 1.

FIG. 2 is a diagram illustrating the memory device 1110 of FIG. 1.

Referring to FIG. 2, the memory device 1110 may include a memory cell array 100 that stores data. The memory device 1110 may include peripheral circuits 200 that may perform a program operation for storing data in the memory cell array 100, a read operation for outputting the stored data, and an erase operation for erasing the stored data. The memory device 1110 may include a control logic 300 that controls the peripheral circuits 200 under the control of the memory controller (1200 of FIG. 1).

The memory cell array 100 may include a plurality of memory blocks MB1 to MBk 110 (k is a positive integer). Local lines LL and bit lines BL1 to BLn (n is a positive integer) may be coupled to the memory blocks MB1 to MBk 110. For example, the local lines LL may include a first select line, a second select line, and a plurality of word lines arranged between the first and second select lines. Also, the local lines LL may further include dummy lines arranged between the first select line and the word lines and between the second select line and the word lines. Here, the first select line may be a source select line, and the second select line may be a drain select line. For example, the local lines LL may include word lines, drain and source select lines, and source lines SL. For example, the local lines LL may further include dummy lines. For example, the local lines LL may further include pipe lines. The local lines LL may be coupled to the memory blocks MB1 to MBk 110, respectively, and the bit lines BL1 to BLn may be commonly coupled to the memory blocks MB1 to MBk 110. The memory blocks MB1 to MBk may be implemented as a two-dimensional (2D) or a three-dimensional (3D) structure. For example, the memory cells in the memory blocks 110 having a 2D structure may be arranged horizontally on a substrate. For example, memory cells in the memory blocks 110 having a 3D structure may be stacked vertically on the substrate.

The peripheral circuits 200 may perform program, read, and erase operations of a selected memory block 110 under the control of the control logic 300. For example, the peripheral circuits 200, under the control of the control logic 300, may supply verify and pass voltages to the first select line, the second select line, and the word lines, selectively discharge the first select line, the second select line, and the word lines, and verify memory cells coupled a selected word line among the word lines. For example, the peripheral circuits 200 may include a voltage generating circuit 210, a row decoder 220, a page buffer group 230, a column decoder 240, an input/output circuit 250, and a sensing circuit 260.

The voltage generating circuit 210 may generate various operating voltages Vop used for program, read, and erase operations in response to an operation signal OP_CMD. Also, the voltage generating circuit 210 may selectively discharge the local lines LL in response to the operation signal OP_CMD. For example, the voltage generating circuit 210 may generate a program voltage, a verify voltage, pass voltages, a turn-on voltage, a read voltage, an erase voltage, a source line voltage, and the like under the control of the control logic 300.

The row decoder 220 may transfer the operating voltages Vop to local lines LL coupled to a selected memory block 110 in response to a row address RADD.

The page buffer group 230 may include a plurality of page buffers PB1 to PBn 231 coupled to the bit lines BL1 to BLn. The page buffers PB1 to PBn 231 may operate in response to page buffer control signals PBSIGNALS. For example, the page buffers PB1 to PBn 231 may temporarily store data received through the bit lines BL1 to BLn, or sense voltages or current of the bit lines BL1 to BLn in a read or verify operation.

The column decoder 240 may transfer data between the input/output circuit 250 and the page buffer group 230 in response to a column address CADD. For example, the column decoder 240 may exchange data with the page buffers 231 through data lines DL, or exchange data with the input/output circuit 250 through column lines CL.

The sensing circuit 260, in a read operation and a verify operation, may generate a reference current in response to a permission bit VRY_BIT<#>, and output a pass signal PASS or a fail signal FAIL by comparing a sensing voltage VPB received from the page buffer group 230 with a reference voltage generated by the reference current.

The control logic 300 may control the peripheral circuits 200 by outputting the operation signal OP_CMD, the row address RADD, the page buffer control signals PBSIGNALS, and the permission bit VRY_BIT<#> in response to the command CMD and the address ADD. Also, the control logic 300 may determine whether the verify operation has passed or failed in response to the pass or fail signal PASS or FAIL.

The input/output circuit 250 may transfer a command CMD and address ADD, which are received from the memory controller, to the control logic 300, or exchange data Data with the column decoder 240. The input/output circuit 250 may transmit data Data transferred from the outside through input/output pins I/O<7:0> to the column decoder 240 through the column lines CL. Also, the input/output circuit 250 may output data output from the column decoder 240 to be transmitted through the column lines CL to an external device through the input/output pins I/O<7:0>. At this time, the output data may be output in synchronization with a read enable clock signal RE_N. Alternatively, the memory device 1100 may output a data strobe signal DQS (not shown). In this case, the output data may be output in synchronization with the data strobe signal DQS.

The input/output circuit 250 may receive a command CMD from the external device and transfer the command CMD to the control logic 300 in a section in which a command latch enable signal CLE is activated. The input/output circuit 250 may receive an address ADD from the external device and transfer the address ADD to the control logic 300 in a section in which an address latch enable signal ALE is activated. The command CMD or the address ADD may be input in synchronization with a write enable signal WE_N input from the external device. In addition, the memory device 1100 may receive an address and a command in a section in which a chip enable signal CE_N is activated.

The memory device 1100 may include a state counter 270. The state counter 270 may generate a count result Res_cnt by counting a number of memory cells included in each a plurality of threshold voltage sections, based on data output from the page buffer group 230. Also, the state counter 270 may provide the count result Res_cnt to the control logic 300. This will be described in detail below.

Figure 3:
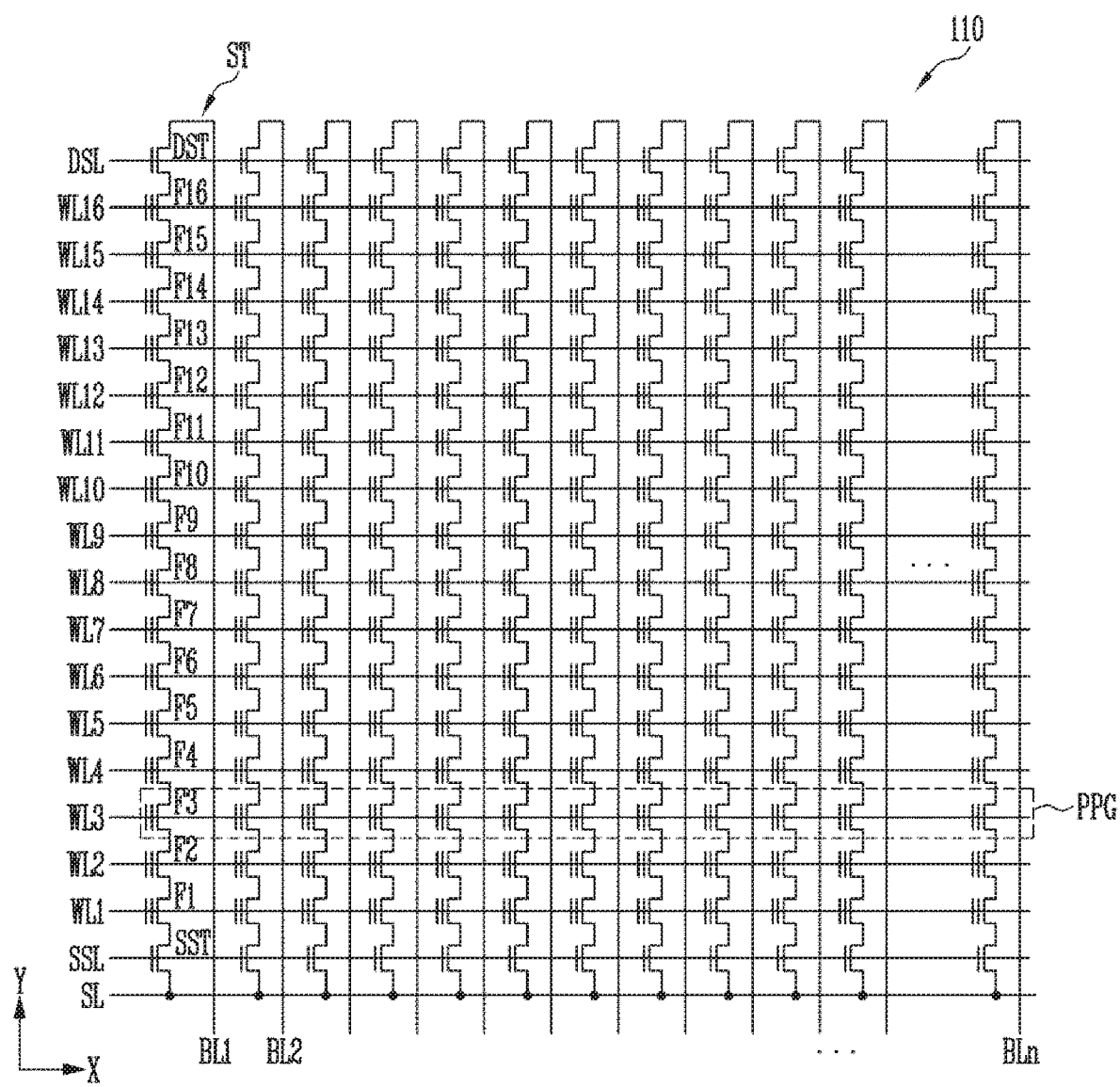
FIG. 3 is a diagram illustrating a memory block of FIG. 2.

FIG. 3 is a diagram illustrating the memory block of FIG. 2.

Referring to FIG. 3, a plurality of word lines arranged in parallel to one another between a first select line and a second select line may be coupled to the first memory block 110. Here, the first select line may be a source select line SSL, and the second select line may be a drain select line DSL. More specifically, the first memory block 110 may include a plurality of strings ST coupled between bit lines BL1 to BLn and a source line SL. The bit lines BL1 to BLn may be coupled to the strings ST, respectively, and the source line SL may be commonly coupled to the strings ST. The strings ST may be configured identically to one another, and therefore, a string ST coupled to a first bit line BL1 will be described in detail as an example.

The string ST may include a source select transistor SST, a plurality of memory cells F1 to F16, and a drain select transistor DST, which are coupled in series to each other between the source line SL and the first bit line BL1. At least one source select transistor SST and at least one drain select transistor DST may be included in one string ST, and memory cells of which number is larger than that of the memory cells F1 to F16 shown in the drawing may be included in one string ST.

A source of the source select transistor SST may be coupled to the source line SL, and a drain of the drain select transistor DST may be coupled to the first bit line BL1. The memory cells F1 to F16 may be coupled in series between the source select transistor SST and the drain select transistor DST. Gates of source select transistors SST included in different strings ST may be coupled to the source select line SSL, gates of drain select transistors DST included in different strings ST may be coupled to the drain select line DSL, gates of the memory cells F1 to F16 included in different strings ST may be coupled to a plurality of word lines WL1 to WL16. A group of memory cells coupled to the same word line among the memory cells included in different strings ST may be a physical page PPG. Therefore, physical pages PPG of which number corresponds to that of the word lines WL1 to WL16 may be included in the first memory block 110.

Each memory cell among plurality of memory cells F1 to F16 may store one bit of data. This is generally called as a single level cell (SLC). In this case, one physical page PPG may store one logical page (LPG) data. The one LPG data may include data bits of which number corresponds to that of cells included in one physical page PPG. In addition, each memory cell among plurality of memory cells F1 to F16 may store two or more bits of data. This is generally called as a multi-level cell. In this case, one physical page PPG may store two or more LPG data.

Figure 4:
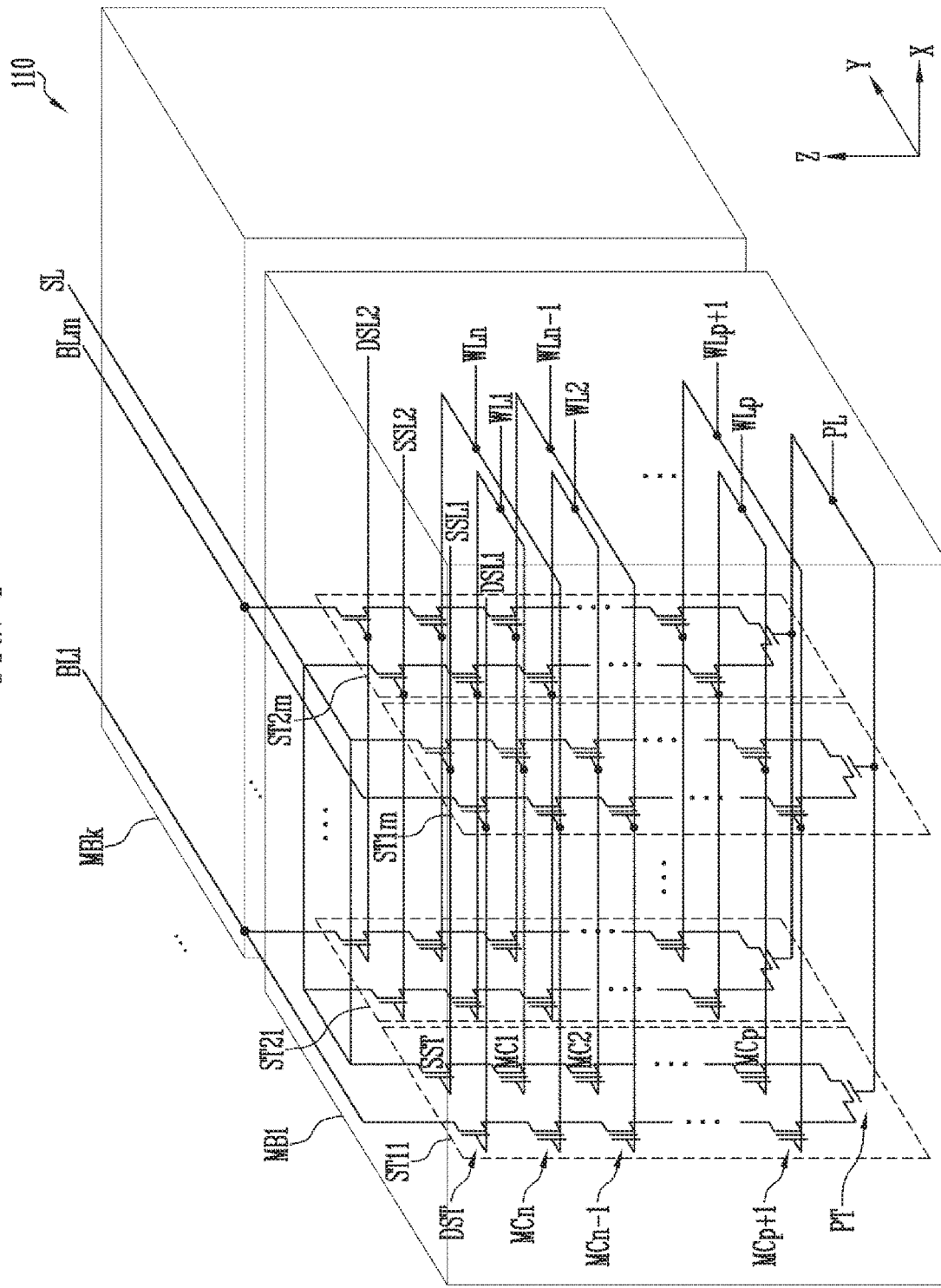
FIG. 4 is a diagram illustrating a three-dimensional (3D) configuration of a memory block.

FIG. 4 is a diagram illustrating a three-dimensional (3D) configuration of a memory block shown in FIG. 2.

Referring to FIG. 4, the memory cell array 100 may include a plurality of memory blocks MB1 to MBk 110. The memory block 110 may include a plurality of strings ST11 to ST1m and ST21 to ST2m. In an embodiment, each of the plurality of strings ST11 to ST1m and ST21 to ST2m may be formed in a 'U' shape. In the memory block 110, m strings may be arranged in a row direction (X direction). Although in FIG. 4 it is illustrated that two strings are arranged in a column direction (Y direction), the present disclosure is not limited thereto. That is, three or more strings may be arranged in the column direction (Y direction).

Each of the plurality of strings ST11 to ST1m and ST21 to ST2m may include at least one source select transistor SST, first to nth memory cells MC1 to MCn, a pipe transistor PT, and at least one drain select transistor DST.

The source and drain select transistors SST and DST and the memory cells MC1 to MCn may have structures similar to one another. For example, each of the source and drain select transistors SST and DST and the memory cells MC1 to MCn may include a channel layer, a tunnel insulating layer, a charge trapping layer, and a blocking insulating layer. For example, a pillar for providing the channel layer may be provided in each string. For example, a pillar for providing at least one of the channel layer, the tunnel insulating layer, the charge trapping layer, and the blocking insulating layer may be provided in each string.

The source select transistor SST of each string may be coupled between a source line SL and memory cells MC1 to MCp.

In an embodiment, source select transistors of strings arranged in the same row may be coupled to a source select line extending in the row direction, and source select transistors of strings arranged in different rows may be coupled to different source select lines. In FIG. 4, source select transistors of strings ST11 to ST1m of a first row may be coupled to a first source select line SSL1. Source select transistors of strings ST21 to ST2m of a second row may be coupled to a second source select line SSL2.

In an embodiment, the source select transistors of the strings ST11 to ST1m and ST21 to ST2m may be commonly coupled to one source select line.

First to nth memory cells MC1 to MCn of each string may be coupled between the source select transistor SST and the drain select transistor DST.

The first to nth memory cells MC1 to MCn may be divided into first to pth memory cells MC1 to MCp and (p+1)th to nth memory cells MCp+1 to MCn. The first to pth memory cells MC1 to MCp may be sequentially arranged in a vertical direction (Z direction), and be coupled in series to each other between the source select transistor SST and the pipe transistor PT. The (p+1)th to nth memory cells MCp+1 to MCn may be sequentially arranged in the vertical direction (Z direction), and be coupled in series to each other between the pipe transistor PT and the drain select transistor DST. The first to pth memory cells MC1 to MCp and the (p+1)th to nth memory cells MCp+1 to MCn may be coupled to each other through the pipe transistor PT. Gates of the first to nth memory cells MC1 to MCn of each string may be coupled to first to nth word lines WL1 to WLn, respectively.

In an embodiment, at least one of the first to nth memory cells MC1 to MCn may be used as a dummy memory cell. When a dummy memory cell is provided, the voltage or current of a corresponding string can be stably controlled. A gate of the pipe transistor PT of each string may be coupled to a pipe line PL.

The drain select transistor DST of each string may be coupled to a bit line and the memory cells MCp+1 to MCn. Strings arranged in the row direction may be coupled to a drain select line extending in the row direction. Drain select transistors of the strings ST11 to ST1, of the first row may be coupled to a first drain select line DSL1. Drain select transistors of the strings ST21 to ST2m of the second row may be coupled to a second drain select line DSL2.

Strings arranged in the column direction may be coupled to bit lines extending in the column direction. In FIG. 4, strings ST11 and ST21 of a first column may be coupled to a first bit line BL1. Strings ST1m and ST2m of an mth column may be coupled to an nth bit line BLn.

Memory cells coupled to the same word line among the strings arranged in the row direction may constitute one page. For example, memory cells coupled to the first word line WL1 among the strings ST11 to ST1m of the first row may constitute one page. Memory cells coupled to the first word line WL1 among the strings ST21 to ST2m of the second row may constitute another page. As any one of the drain select lines DSL1 and DSL2 is selected, strings arranged in one row direction may be selected. As any one of the word lines WL1 to WLn is selected, one page among the selected strings may be selected.

Figure 5:
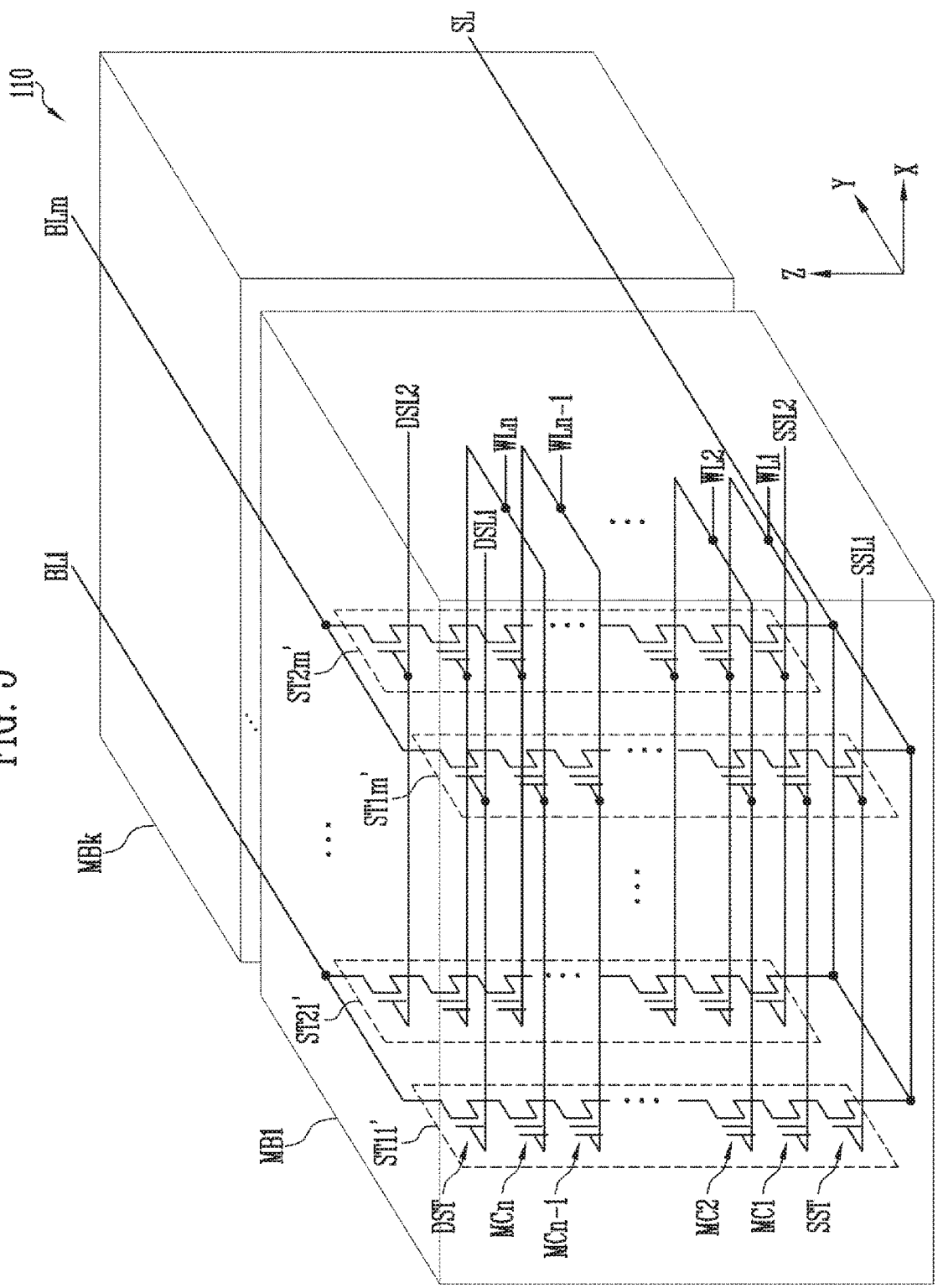
FIG. 5 is a diagram illustrating a three-dimensional (3D) configuration of a memory block.

FIG. 5 is a diagram illustrating a three-dimensional configuration of the memory block shown in FIG. 2.

Referring to FIG. 5, the memory cell array 100 may include a plurality of memory blocks MB1 to MBk 110. The memory block 110 may include a plurality of strings ST11' to ST1m' and ST21' to ST2m'. Each of the plurality of strings ST11' to ST1m' and ST21' to ST2m' may extend along a vertical direction (Z direction). In the memory block 110, m strings may be arranged in a row direction (X direction). Although in FIG. 5 it is illustrated that two strings are arranged in a column direction (Y direction), the present disclosure is not limited thereto. That is, three or more strings may be arranged in the column direction (Y direction).

Each of the plurality of strings ST11' to ST1m' and ST21' to ST2m' may include at least one source select transistor SST, first to nth memory cells MC1 to MCn, and at least one drain select transistor DST.

The source select transistor SST of each string may be coupled between a source line SL and the memory cells MC1 to MCn. Source select transistors of strings arranged in the same row may be coupled to the same source select line. Source select transistors of strings ST11' to ST1m' arranged on a first row may be coupled to a first source select line SSL1. Source select transistors of strings ST21' to ST2m' arranged on a second row may be coupled to a second source select line SSL2. In an embodiment, the source select transistors of the strings ST11' to ST1m' and ST21' to ST2m' may be commonly coupled to one source select line.

The first to nth memory cells MC1 to MCn of each string may be coupled in series to each other between the source select transistor SST and the drain select transistor DST. Gates of the first to nth memory cells MC1 to MCn may be coupled to first to nth word lines WL1 to WLn, respectively.

In an embodiment, at least one of the first to nth memory cells MC1 to MCn may be used as a dummy memory cell. When a dummy memory cell is provided, the voltage or current of a corresponding string can be stably controlled. Accordingly, the reliability of data stored in the memory block 110 can be improved.

The drain select transistor DST of each string may be coupled between a bit line and the memory cells MC1 to MCn. Drain select transistors DST of strings arranged in the row direction may be coupled to a drain select line extending in the row direction. The drain select transistors DST of the strings ST11' to ST1m' of the first row may be coupled to a first drain select line DSL1. The drain select transistors DST of the strings ST21' to ST2m' of the second row may be coupled to a second drain select line DSL2.

That is, the memory block 110 of FIG. 5 may have a substantially similar circuit to that of the memory block 110 of FIG. 4, except that the pipe transistor PT may be excluded from each string in the memory block 110 of FIG. 5.

Figure 6:
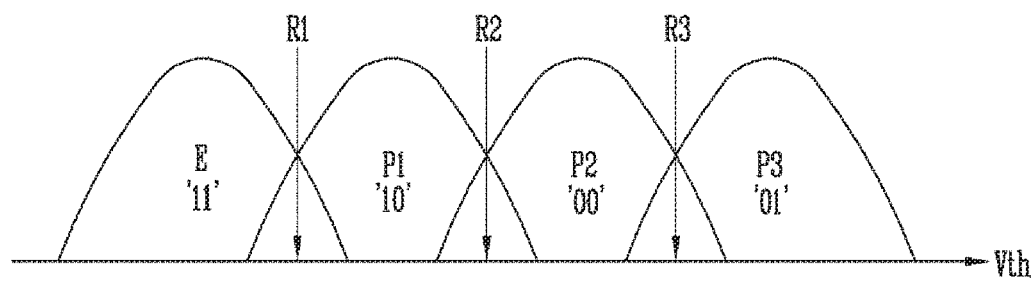
FIG. 6 is a diagram illustrating a read operation according to an embodiment of the present disclosure.

FIG. 6 is a diagram illustrating a read operation according to an embodiment of the present disclosure.

Referring to FIG. 6, each memory cell may store data of 2 bits, for example. The memory cells included in one physical page PPG may form an erase threshold voltage distribution E, a first program threshold voltage distribution P1, a second program threshold voltage distribution P2, and a third program threshold voltage distribution P3 as shown in FIG. 6. In an embodiment, when one memory cell stores 3 bits of data, memory cells included in one physical page PPG may form one erase threshold voltage distribution and seven program threshold voltage distributions.

As time passes after memory cells are programmed, threshold voltages of the memory cells may be lower or higher than those of the memory cells just after the memory cells are programmed. Therefore, a threshold voltage distribution formed after time has passed may be further widened than that formed just after the memory cells are programmed. As a result, portions of adjacent threshold voltage distributions may overlap with each other as shown in FIG. 6. When the threshold voltage distribution is excessively widened, a read operation may fail. In other words, when the threshold voltage is widened, a plurality of error bits may be included in data read from a memory cell in the read operation. When the number of error bit becomes a certain level or more, an error correction operation may fail. The failure of the error correction operation in the read operation may degrade the reliability of the memory system 1000. Therefore, an operation of extracting information on threshold voltage distributions of memory cells may be required to prevent the degradation of the reliability.

When a memory cell stores data of 2 bits, the data of 2 bits may be read by an operation of reading the least significant bit (LSB), i.e., an LSB read operation and an operation of reading the most significant bit (MSB), i.e. an MSB read operation. In an embodiment, the LSB read operation may be performed by a one-time read operation, using a second read voltage R2. In addition, the MSB read operation may be performed by a two-time read operation, using a first read voltage R1 and a third read voltage R3. 2 bits may be extracted from each memory cell by the LSB read operation and the MSB read operation. As a result, memory cells of which threshold voltages are lower than the first read voltage R1 may have a threshold voltage state corresponding to a binary bit-value '11,' and memory cells having threshold voltages between the first read voltage R1 and the second read voltage R2 may have a threshold voltage state corresponding to a binary bit-value '10.' In addition, memory cells having threshold voltages between the second read voltage R2 and the third read voltage R3 may have a threshold voltage state corresponding to a binary bit-value '00,' and memory cells of which threshold voltages are higher than the third read voltage R3 may have a threshold voltage state corresponding to a binary bit-value '01.'

The state counter 270 according to an embodiment may count a number of data bits corresponding to each threshold voltage state from the data read by the LSB read operation and the MSB read operation, and extract a number of memory cells included in each threshold voltage state, based on the counted number of data bits. In other words, the state counter 270 may count a number of memory cells having the threshold voltage state corresponding to a binary bit-value '11,' a number of memory cells having the threshold voltage state corresponding to a binary bit-value '10,' a number of memory cells having the threshold voltage state corresponding to a binary bit-value '00,' and a number of memory cells having the threshold voltage state corresponding to a binary bit-value '01' from data read by the LSB read operation and the MSB read operation, which are performed using the first read voltage R1, the second read voltage R2, and the third read voltage R3.

Figure 7:
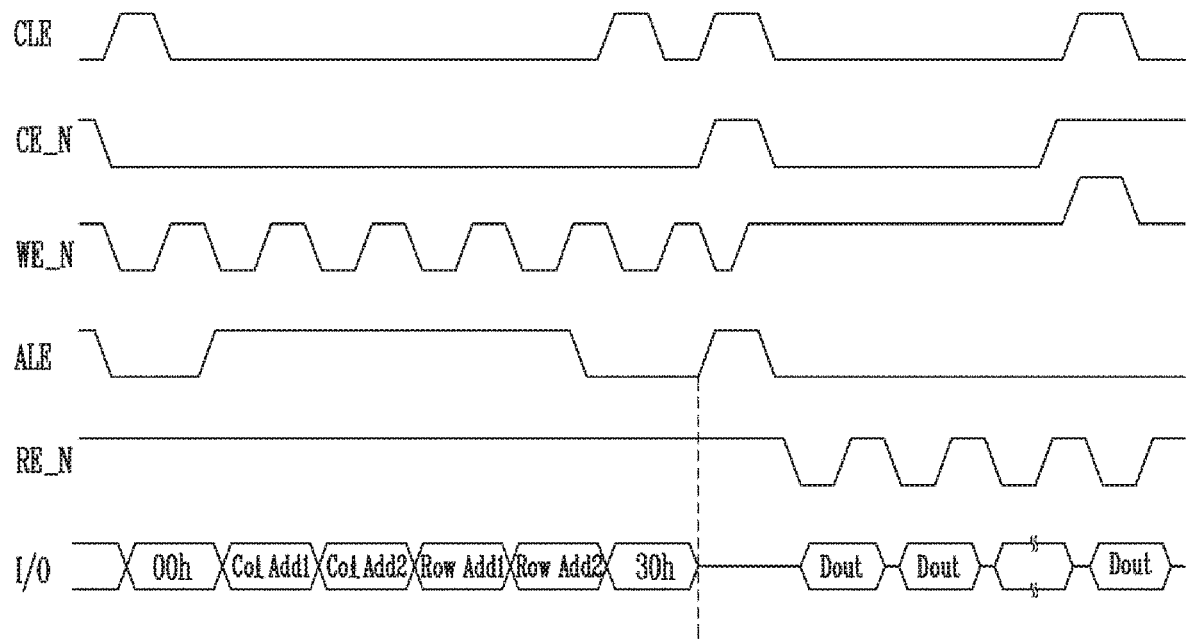
FIG. 7 is a diagram illustrating a sequence of a user read command according to an embodiment of the present disclosure.

FIG. 7 is a diagram illustrating a sequence of a user read command according to an embodiment of the present disclosure.

Referring to FIG. 7, the memory device 1100 may receive a user read command and a read address to perform an LSB read operation or an MSB read operation. The LSB read operation and the MSB read operation may be distinguished from each other by the read address under the same read command.

The memory device 1100 may receive a user read command and a read address through the input/output pins I/O<7:0> while the chip enable signal CE_N is being activated. In general, the chip enable signal CE_N may have a value corresponding to logic low when it is activated. The memory device 1100 may receive a preamble of the user read command while the chip enable signal CE_N and the latch enable signal CLE are being activated. In general, the preamble of the user read command may be configured as '00h.'

The memory device 1100 receives the preamble of the user read command, i.e., '00h,' and may receive the read address after the command latch enable signal CLE is deactivated. The read address may be input to the memory device 1100 in a section in which the address latch enable signal ALE is activated. In an embodiment, the read address may be input during four cycles. A first column address Col Add1 and a second column address Col Add2 may be input to the memory device 1100 during the first two cycles. Then, a first row address Row Add1 and a second row address Row Add2 may be input to the memory device 1100 during the other two cycles.

The address enable signal ALE may be deactivated after the read address is input. The command latch enable signal CLE may be again activated after the address enable signal ALE is deactivated and the memory device 1100 may receive a postamble of the user read command while the command latch enable signal CLE is being activated. In general, the postamble of the user read command may be configured as '30h.' A process in which the preamble of the user read command, the read address, and the postamble of the user read command are input to the memory device 1100 may be designated as a user read command sequence. In other words, the user read command sequence may mean the entire process in which the read command and the read address are input to the memory device 1100. In addition, the postamble of the user read command, i.e., '30h' may be designated as a confirm command. If the confirm command is input to the memory device 1100, the memory device 1100 may start a read operation of reading data from memory cells.

The command latch enable signal CLE may be deactivated after the postamble of the user read command, i.e., '30h' is input. Then, the memory device 1100 may internally perform a read operation of reading data stored in memory cells. The user read command and the read address may be input to the memory device 1100 through the input/output circuit 250 of FIG. 2.

When the read address indicates an LSB page, the page buffer group 230 of the memory device 1100 may perform the read operation, using the second read voltage R2 of FIG. 6. In addition, when the read address indicates an MSB page, the page buffer group 230 of the memory device 1100 may perform the read operation, using the first read voltage R1 and the third read voltage R3 of FIG. 6. In other words, in the MSB read operation, the memory device 1100 may extract 1 bit from each memory cell, using a plurality of read voltages.

The read command or the read address may be input to the memory device 1100 in synchronization with the write enable signal WE_N. In other words, the write enable signal WE_N may toggle while the read command or the read address is being input.

The page buffer group 230 may store data read from the memory cell in response to the read address and the read command. Subsequently, the data stored in the page buffer group 230 may be output to the outside through the input/output pins I/O<7:0> as denoted with "Dout" in FIG. 7.

The above-described read command, i.e., the read command configured with the preamble of '00h' and the postamble of '30h' may be a command sequence that is published to users. The read command may be referred to as a user read command. Unlike the user read command, data stored in each memory cell may be read in response to a test read command so as to test the memory device 1100. In general, the test read command is not published to users but may be controlled by only a manufacturer.

Figure 8:
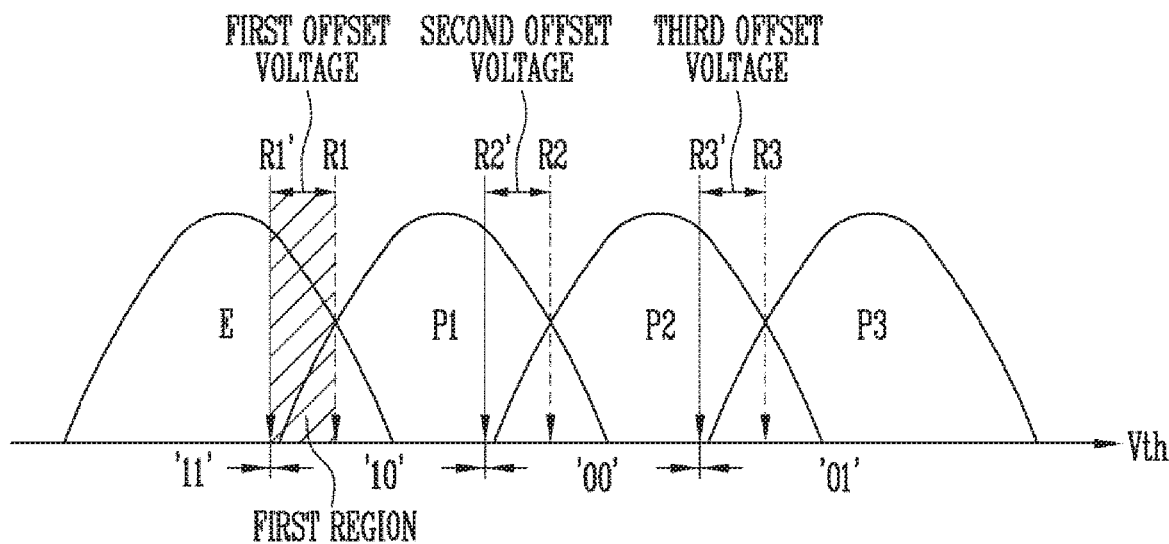
FIG. 8 is a diagram illustrating a read operation according to an embodiment of the present disclosure.

FIG. 8 is a diagram illustrating a read operation according to an embodiment of the present disclosure.

Referring to FIG. 8, the LSB read operation or the MSB read operation may be performed by varying a read voltage. In other words, a second read voltage R2' obtained as the second read voltage R2 is to changed by a second offset voltage may be used rather than the second read voltage set to an initial value in the LSB read operation. In addition, a first read voltage R1' obtained as the first read voltage R1 is changed by a first offset voltage and a third read voltage R3' obtained as the third read voltage R3 is changed by a third offset voltage may be used rather than the first read voltage R1 and the third read voltage R3, which are set to initial values in the MSB read operation. The first to third offset voltages may be equal to or different from one another. Also, the first to third offset voltages may be input from the external device through the input/output circuit 250. In this case, the first to third offset voltages may be input in the form of digital code values from the external device through the input/output circuit 250.

When the LSB read operation and the MSB read operation are performed using the first to third read voltages R1', R2', and R3' changed by the first to third offset voltages, memory cells of threshold voltages are lower than the first read voltage R1' varied based on the first offset voltage may have a threshold voltage state corresponding to a binary bit-value '11.' In addition, memory cells having threshold voltages between the first read voltage R1' varied based on the first offset voltage and the second read voltage R2' varied based on the second offset voltage may have a threshold voltage state corresponding to a binary bit-value '10.' In addition, memory cells having threshold voltages between the second read voltage R2' varied based on the second offset voltage and the third read voltage R3' varied based on the third offset voltage may have a threshold voltage state corresponding to a binary bit-value '00.' Finally, memory cells of threshold voltages are higher than the third read voltage R3' varied based on the third offset voltage may have a threshold voltage state corresponding to a binary bit-value '01.'

In an embodiment, the memory cells that have the threshold voltage state corresponding to a binary bit-value '11' through the LSB read operation and the MSB read operation, which are performed based on the first to third read voltages R1, R2, and R3, and have the threshold voltage state corresponding to a binary bit-value '10' through the LSB read operation and the MSB read operation, which are performed based on the first to third read voltages R1', R2', and R3' varied through the first to third offset voltages refer to memory cells included in a first region. In other words, the number of memory cells included in the first region may be extracted by subtracting the number of memory cells that have threshold voltage state corresponding to a binary bit-value '10' through the LSB read operation and the MSB read operation, which are performed based on the first to third read voltages R1', R2', and R3' varied through the first to third offset voltages from the number of memory cells that have the threshold voltage state corresponding to a binary bit-value '11' through the LSB read operation and the MSB read operation, which are performed based on the first to third read voltages R1, R2, and R3.

As described in FIG. 6, the threshold voltage distribution of memory cells may be widened or moved as time passes after a program operation is performed. As a result, a read operation may be performed to using a read voltage changed as an offset is provided to a read voltage set as an initial value in order to reliably read data from the memory cells having the distorted threshold voltage distribution.

An offset voltage may be input to the memory device 1100 before the user read command is applied. In an embodiment, in the LSB read operation, the memory device 1100 may first receive an offset voltage and then receive the user read command and the read address. The memory device 1100 may perform the read operation, using a new read voltage that is adjusted by the offset voltage input to the read voltage R2 set to the initial value in response to the user read command and the read address. In an embodiment, an offset voltage may be input after the read address and the user read command are applied. Also, the offset voltage may be input during the read command sequence. In an embodiment, the offset voltage may be input before the read address is input after the preamble of the user read command of the read command sequence is input. The MSB read operation may also be performed by receiving one offset voltage. In this case, the same offset voltage may be applied to the first read voltage R1 and the third read voltage R3.

In an example, two offset voltages, i.e., the first offset voltage and the second offset voltage may be input before the user read command is applied. In an embodiment, the MSB read operation may be performed using two or more read voltages. In this case, the memory device 1100 may receive a plurality of offset voltages such that the offset voltages are differently applied to a plurality of read voltages, respectively. For example, the memory device 1100 may perform the read operation, using a new read voltage obtained as the first read voltage R1 of FIG. 8 is adjusted by the first offset voltage and a new read voltage obtained as the third read voltage R3 of FIG. 8 is adjusted by the second offset voltage.

FIGS. 9 to 12 are diagrams illustrating an operation of extracting a threshold voltage distribution according to an embodiment of the present disclosure.

Figure 9:
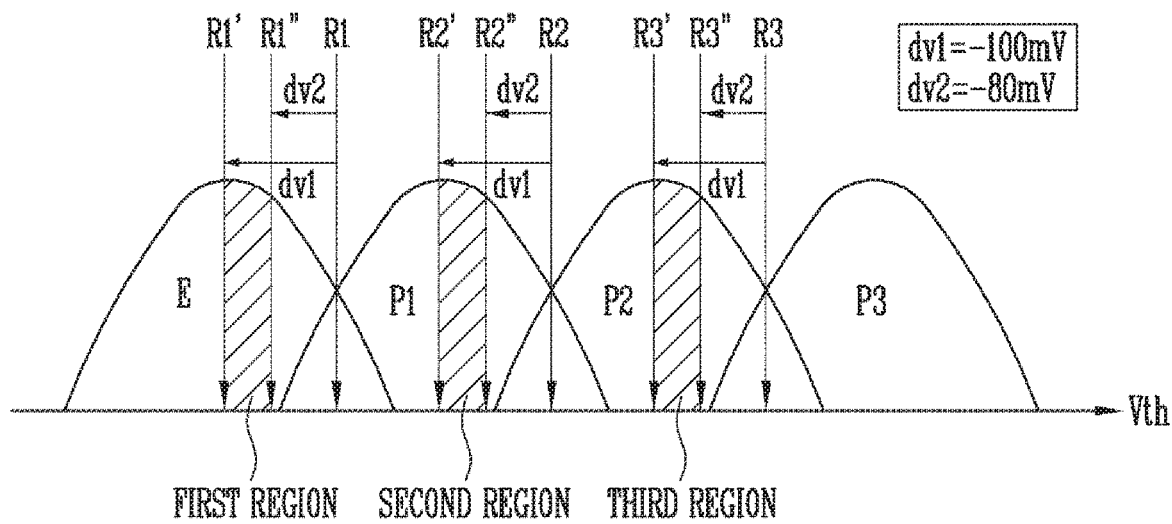

Referring to FIGS. 9 and 10, the memory device 1100 may perform a read operation plurality of times by varying read voltages. First, the LSB read operation and the MSB read operation may be performed using new first to third read voltages R1', R2', and R3' obtained as the first to third read voltages R1, R2, and R3 are varied by a first offset voltage dV1. This LSB and MSB read operation with the first to third read voltages R1', R2', and R3' is referred to as a first loop Loop 1 in this example. In an embodiment, the first offset voltage dV1 may be −100 mV. Then, the LSB read operation and the MSB read operation may be performed using new first to third read voltages R1", R2", and R3" obtained as the first to third read voltages R1, R2, and R3 are varied by a second offset voltage dV2. This LSB and MSB read operation with the first to third read voltages R1", R2", and R3" is referred to as a second loop Loop 2 in this example. In an embodiment, the second offset voltage dV2 may be −80 mV.

The memory device 1100 may count a number of data bits corresponding to a binary bit-value '11,' a number of data bits corresponding to a binary bit-value '10,' a number of data bits corresponding to a binary bit-value '00,' and a number of data bits corresponding to a binary bit-value '01' from data read through the first loop Loop 1, i.e., through the LSB read operation and the MSB read operation, using the first offset voltage dV1. In an embodiment, a binary bit-value '10' may be a case where the result of the LSB read operation is determined as a binary bit-value '1,' i.e., an on-cell in a read operation using the second read voltage R2', and the result of the MSB read operation is determined as a binary bit-value '0,' i.e., an off-cell in a read operation using the first read voltage R1'. In an embodiment, a binary bit-value '10' may be a case where the result of the MSB read operation is determined as a binary bit-value '1' and the result of the LSB read operation is determined as a binary bit-value '0.' FIG. 10 illustrates a case where, from data read through the first loop Loop1, the number of data bits corresponding to a binary bit-value '11' is 3, the number of data bits corresponding to a binary bit-value '10' is 6, the number of data bits corresponding to a binary bit-value '00' is 4, and the number of data bits corresponding to a binary bit-value '01' is 7.

The memory device 1100 may count a number of data bits corresponding to a binary bit-value '11,' a number of data bits corresponding to a binary bit-value '10,' a number of data bits corresponding to a binary bit-value '00,' and a number of data bits corresponding to a binary bit-value '01' from data read through the second loop Loop 2, i.e., through the LSB read operation and the MSB read operation, using the second offset voltage dV2. FIG. 10 illustrates a case where, from data read through the second loop Loop 2, the number of data bits corresponding to a binary bit-value '11' is 5, the number of data bits corresponding to a binary bit-value '10' is 5, the number of data bits corresponding to a binary bit-value '00' is 4, and the number of data bits corresponding to a binary bit-value '01' is 6.

When comparing the result obtained through the first loop Loop 1 with the result obtained through the second loop Loop 2, the number of data bits corresponding to a binary bit-value '11' is 3 in the first loop Loop 1, and the number of data bits corresponding to a binary bit-value '11' is 5 in the second loop Loop 2. 2 is derived by subtracting 3 from 5. This means that the number of memory cells included in a first region of FIG. 9 is 2. In other words, the first region is a region in which memory cells determined as off-cells in the first loop Loop 1 using the first read voltage R1' adjusted by the first offset voltage dV1 and memory cells determined as on-cells in the second loop Loop 2 using the first read voltage R1" adjusted by the second offset voltage dV2 are located. As exemplified in FIG. 10, a number of memory cells located in the first region corresponds to difference in the number of memory cells determined as corresponding to a binary bit-value '10' in the first loop Loop 1 and determined as corresponding to a binary bit-value '11' in the second loop Loop 2. In this manner, the number of memory cells included in the first region can be counted.

When comparing the result obtained through the first loop Loop 1 with the result obtained through the second loop Loop 2, the number of data bits corresponding to a binary bit-value '10' is 6 in the first loop Loop 1, and the number of data bits corresponding to a binary bit-value '10' is 5 in the second loop Loop 2. That is, 9 is derived by adding the number of data bits corresponding to a binary bit-value '11' and a binary bit-value '10' in the first loop Loop 1, and 10 is derived by adding the number of data bits corresponding to a binary bit-value '11' and a binary bit-value '10' in the second loop Loop 2. 1 is derived by subtracting 9 from 10. This means that the number of memory cells included in a second region of FIG. 9 is 1. In other words, the second region is a region in which memory cells determined as off-cells in the first loop Loop 1 using the second read voltage R2' adjusted by the first offset voltage dV1 and memory cells determined as on-cells in the second loop Loop 2 using the second read voltage R2" adjusted by the second offset voltage dV2 are located. As exemplified in FIG. 10, a number of memory cells located in the second region corresponds to difference in the number of memory cells determined as corresponding to a binary bit-value '00' in the first loop Loop 1 and determined as corresponding to a binary bit-value '10' in the second loop Loop 2. In this manner, the number of memory cells included in the second region can be counted.

When comparing the result obtained through the first loop Loop 1 with the result obtained through the second loop Loop 2, the number of data bits corresponding to a binary bit-value '00' is 4 in the first loop Loop 1, and the number of data bits corresponding to a binary bit-value '00' is 4 in the second loop Loop 2. That is, 13 is derived by adding the number of data bits corresponding to a binary bit-value '11,' a binary bit-value '10,' and a binary bit-value '00' in the first loop Loop 1, and 14 is derived by adding the number of data bits corresponding to a binary bit-value '11,' a binary bit-value '10,' and a binary bit-value '00' in the second loop Loop 2. 1 is derived by subtracting 13 from 14. This means that the number of memory cells included in a third region of FIG. 9 is 1. In other words, the third region is a region in which memory cells determined as off-cells in the first loop Loop 1 using the third read voltage R3' adjusted by the first offset voltage dV1 and memory cells determined as on-cells in the second loop Loop 2 using the third read voltage R3" adjusted by the second offset voltage dV2 are located. As exemplified in FIG. 10, a number of memory cells located in the third region corresponds to difference in the number of memory cells determined as corresponding to a binary bit-value '01' in the first loop Loop 1 and determined as corresponding to a binary bit-value '00' in the second loop Loop 2. In this manner, the number of memory cells included in the third region can be counted.

Referring to FIG. 11, the number of data bits corresponding to a binary bit-value '11' is 3 in the first loop Loop 1, and the number of data bits corresponding to a binary bit-value '11' is 5 in the second loop Loop 2. That is, a value obtained by subtracting the number of data bits corresponding to a binary bit-value '11' in the first loop Loop 1 from the number of data bits corresponding to a binary bit-value '11' in the second loop Loop 2 means the number of memory cells included in the first region. In other words, the number of memory cells determined as on-cells in the read operation using the first read voltage R1' in the first loop Loop 1 is the number of data bits corresponding to a binary bit-value '11' in the first loop Loop 1, and the number of memory cells determined as on-cells in the read operation using the first read voltage R1" in the second loop Loop 2 is the number of data bits corresponding to a binary bit-value '11' In the second loop Loop 2. That is, the number of memory cells included in the first region can be extracted by subtracting the number of data bits corresponding to a binary bit-value '11' in the first loop Loop 1 from the number of data bits corresponding to a binary bit-value '11' in the second loop Loop 2. The counting operation and the subtracting and adding operations, which are described above, may be performed by the state counter 270 of FIG. 2.

The number of data bits corresponding to a binary bit-value '11' and a binary bit-value '10' is 9 In the first loop Loop 1, and the number of data bits corresponding to a binary bit-value '11' and a binary bit-value '10' is 10 in the second loop Loop 2. That is, a value obtained by subtracting the number of data bits corresponding to a binary bit-value '11' and a binary bit-value '10' in the first loop Loop 1 from the number of data bits corresponding to a binary bit-value '11' and a binary bit-value '10' in the second loop Loop 2 means the number of memory cells included in the second region. In other words, the number of memory cells determined as on-cells in the read operation using the second read voltage R2' adjusted by the first offset voltage dV1 in the first loop Loop 1 is the number of data bits corresponding to a binary bit-value '11' and a binary bit-value '10' in the first loop Loop 1, and the number of memory cells determined as on-cells in the read operation using the second read voltage R2" adjusted by the second offset voltage dV2 in the second loop Loop 2 is the number of data bits corresponding to a binary bit-value '11' and a binary bit-value '10' in the second loop Loop 2. That is, the number of memory cells included in the second region can be extracted by subtracting the number of data bits corresponding to a binary bit-value '11' and a binary bit-value '10' in the first loop Loop 1 from the number of data bits corresponding to a binary bit-value '11' and a binary bit-value '10' in the second loop Loop 2. The counting operation and the subtracting and adding operations, which are described above, may be performed by the state counter 270 of FIG. 2.

The number of data bits corresponding to a binary bit-value '11,' a binary bit-value '10,' and a binary bit-value '00' is 13 in the first loop Loop 1, and the number of data bits corresponding to a binary bit-value '11,' a binary bit-value '10,' and a binary bit-value '00' is 14 in the second loop Loop 2. That is, a value obtained by subtracting the number of data bits corresponding to a binary bit-value '11,' a binary bit-value '10,' and a binary bit-value '00' in the first loop Loop 1 from the number of data bits corresponding to a binary bit-value '11,' a binary bit-value '10,' and a binary bit-value '00' in the second loop Loop 2 means the number of memory cells included in the third region. In other words, the number of memory cells determined as on-cells in the read operation using the third read voltage R3' in the first loop Loop 1 is the number of data bits corresponding to a binary bit-value '11,' a binary bit-value '10,' and a binary bit-value '00' in the first loop Loop 1, and the number of memory cells determined as on-cells in the read operation using the third read voltage R3" in the second loop Loop 2 is the number of data bits corresponding to a binary bit-value '11,' a binary bit-value '10,' and a binary bit-value '00' in the second loop Loop 2. That is, the number of memory cells included in the third region can be extracted by subtracting the number of data bits corresponding to a binary bit-value '11,' a binary 20 bit-value '10,' and a binary bit-value '00' in the first loop Loop 1 from the number of data bits corresponding to a binary bit-value '11,' a binary bit-value '10,' and a binary bit-value '00' in the second loop Loop 2. The counting operation and the subtracting and adding operations, which are described above, may be performed by the state counter 270 of FIG. 2.

Figure 12:
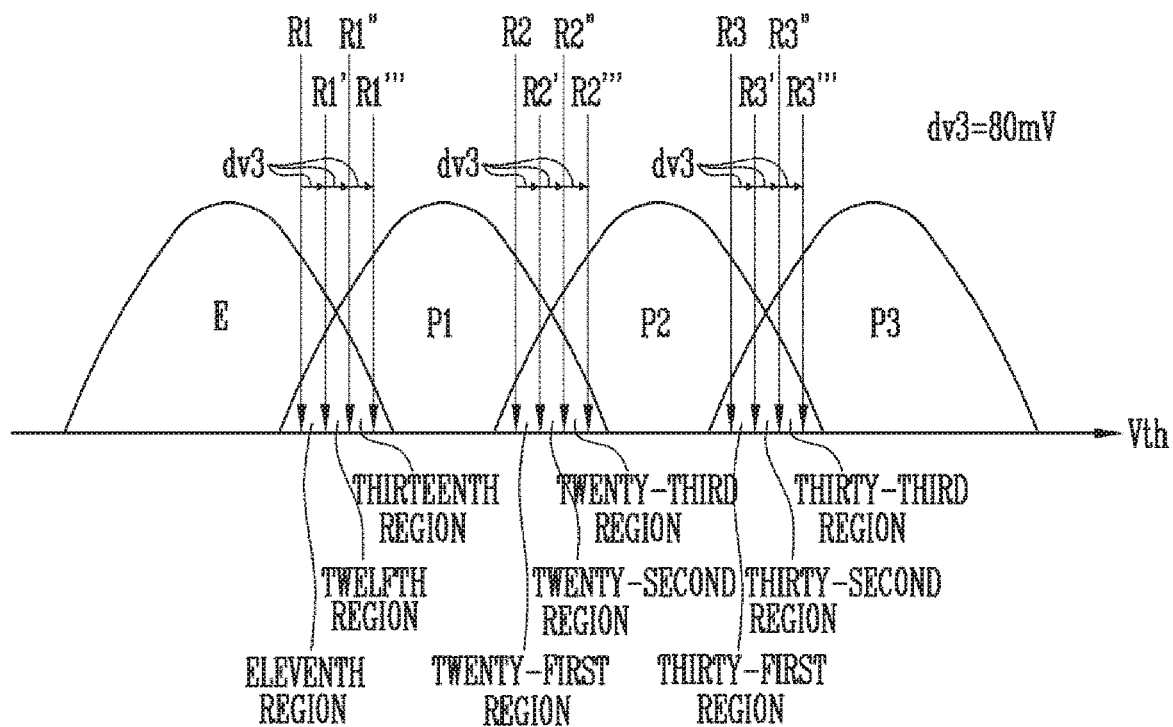

Referring to FIG. 12, when the above-described operation is repeatedly performed by changing offset voltages, the memory device 1100 may extract the entire threshold voltage distribution of memory cells. That is, when the memory device 1100 first performs the LSB read operation and the MSB operation, using first to third read voltages R1, R2, and R3 set as initial values and then performs the LSB read operation and the MSB operation, using first to third read voltages R1', R2', and R3' to which a third offset voltage dV3 is applied, a number of memory cells included in an eleventh region, a number of memory cells included in a twenty-first region, and a number of memory cells included in a thirty-first region may be extracted. Then, when the memory device 1100 performs the LSB read operation and the MSB operation, using first to third read voltages R1", R2", and R3" to which an offset voltage corresponding to two times of the third offset voltage dV3 is applied, a number of memory cells included in a twelfth region, a number of memory cells included in a twenty-second region, and a number of memory cells included in a thirty-second region may be additionally extracted. In addition, when the memory device 1100 performs the LSB read operation and the MSB operation, using first to third read voltages R1''', R2''', and R3''' to which an offset voltage corresponding to three times of the third offset voltage dV3 is applied, a number of memory cells included in a thirteen region, a number of memory cells included in a twenty-third region, and a number of memory cells included in a thirty-third region may be additionally extracted. If a read operation is repeatedly performed in this manner, the entire threshold voltage distribution of memory cells included in one physical page PPG can be extracted. In an embodiment, the third offset voltage dV3 may be 80 mV.

The above-described operation of extracting a threshold voltage distribution may be performed by inputting a user command and an offset voltage to the memory device 1100. Unlike the test read command sequence, the user command sequence is published to users as described above. Thus, a threshold voltage distribution of memory cells can be extracted using the user command sequence, without implementing a separate test read command sequence. Accordingly, the design overhead of the memory device 1100 can be decreased, and the time required to extract the threshold voltage distribution can be reduced.

Figure 13:
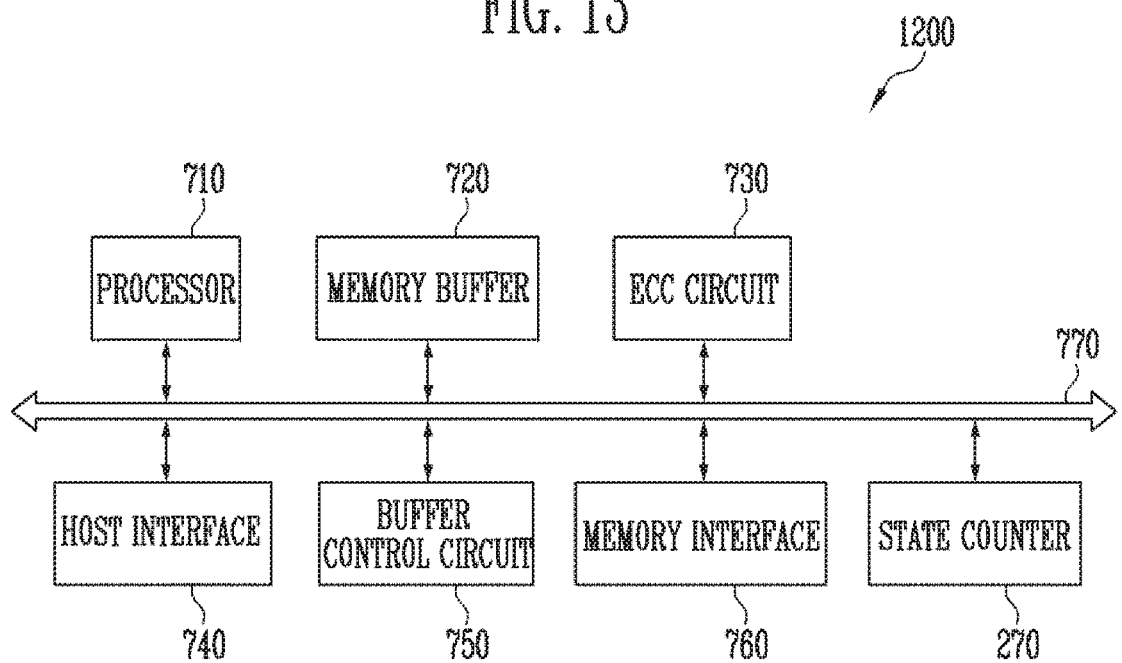
FIG. 13 is a diagram illustrating a memory controller according to an embodiment of the present disclosure.

FIG. 13 is a diagram illustrating the memory controller 1200 of FIG. 1 according to an embodiment of the present disclosure.

Referring to FIG. 13, the memory controller 1200 may include a processor 710, a memory buffer 720, an error correction code (ECC) circuit 730, a host interface 740, a buffer control circuit 750, a memory interface 760, and a bus 770.

The bus 770 may provide channels between components of the memory controller 1200.

The processor 710 may control overall operations of the memory controller 1200, and perform a logical operation. The processor 710 may communicate with the external host 2000 through the host interface 740, and communicate with the memory device 1100 through the memory interface 760. Also, the processor 710 may communicate with the memory buffer 720 through the buffer control circuit 750. The processor 710 may control an operation of the memory system 1000 by using the memory buffer 720 as a working memory, a cache memory, or a buffer memory.

The memory buffer 720 may be used as the working memory, the cache memory, or the buffer memory of the processor 710. The memory buffer 720 may store codes and commands, which are executed by the processor 710. The memory buffer 720 may include a static RAM (SRAM) or a dynamic RAM (DRAM).

The ECC circuit 730 may perform an ECC operation. The ECC circuit 730 may perform ECC encoding on data to be written in the memory device 1100 through the memory interface 760. The ECC encoded data may be transferred to the memory device 1100 through the memory interface 760. The ECC circuit 730 may perform ECC decoding on data received from the memory device 1100 through the memory interface 760. As an example, the ECC circuit 730 may be included as a component of the memory interface 760 in the memory interface 760.

The host interface 740 may communicate with the external host 2000 under the control of the processor 710. The host interface 740 may communicate with the host 2000, using at least one of various communication manners, such as a universal serial bus (USB), a serial AT attachment (SATA), a high speed interchip (HSIC), a small computer system interface (SCSI), Firewire, a peripheral component interconnection (PCI), a PCI express (PCIe), a nonvolatile memory express (NVMe), a universal flash storage (UFS), a secure digital (SD), a multimedia card (MMC), an embedded MMC (eMMC), a dual in-line memory module (DIMM), a registered DIMM (RDIMM), and a load reduced DIMM (LRDIMM).

The buffer control circuit 750 may control the memory buffer 720 under the control of the processor 710.

The memory interface 760 may communicate with the memory device 1100 under the control of the processor 710. The memory device 760 may communicate a command, an address, and data with the memory device 1100 through a channel.

In an embodiment, the memory controller 1200 may not include the memory buffer 720 and the buffer control circuit 750.

In an embodiment, the processor 710 may control an operation of the memory controller 1200, using codes. The processor 710 may load codes from a nonvolatile memory device (e.g., a read only memory (ROM)) provided inside the memory controller 1200. As an example, the processor 710 may load codes from the memory device 1100 through the memory interface 760.

In an embodiment, the bus 770 of the memory controller 1200 may be divided into a control bus and a data bus. The data bus may transmit data in the memory controller 1200, and the control bus may transmit control information such as a command and an address in the memory controller 1200. The data bus and the control bus are separated from each other, and may not interfere or influence with each other. The data bus may be coupled to the host interface 740, the buffer control circuit 750, the ECC circuit 730, and the memory interface 760. The control bus may be coupled to the host interface 740, the processor 710, the buffer control circuit 750, the memory buffer 720, and the memory interface 760.

The memory controller 1200 may also include a state counter 270. In other words, the state counter 270 may be included in the memory device 1100 as shown in FIG. 2 or be included in the memory controller 1200 as shown in FIG. 13. When the memory controller 1200 includes the state counter 270, the above-described user read command may be input to the memory device 1100 by the memory controller 1200. The memory device 1100 may perform an LSB read operation and an MSB read operation in response to the user read command transmitted from the memory controller 1200, and output data read through the LSB read operation and the MSB read operation to the memory controller 1200. The state counter 270 of the memory controller 1200 may extract a number of memory cells in a specific region through an operation including a subtracting operation on the data read through the LSB read operation and the MSB read operation, which is output from the memory device 1100. As a result, a threshold voltage distribution of memory cells can be extracted.

Figure 14:
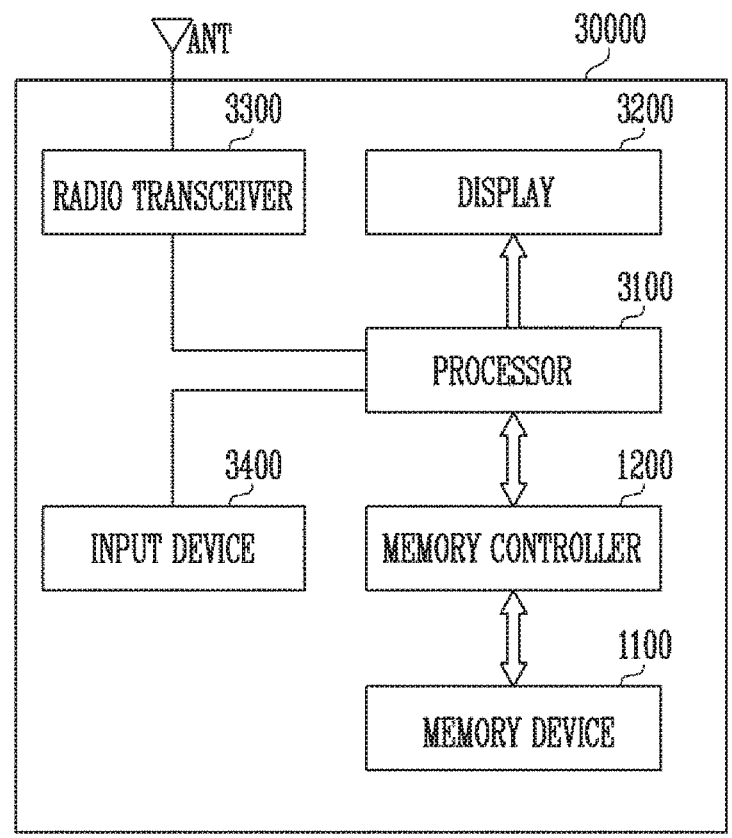
FIG. 14 is a diagram illustrating another embodiment of the memory system including the memory device shown in FIG. 2.

FIG. 14 is a diagram illustrating an application example of the memory system including the memory device shown in FIG. 2.

Referring to FIG. 14, the memory system 30000 may be implemented as a cellular phone, a smart phone, a tablet PC, a personal digital assistant (PDA), or a wireless communication device. The memory system 30000 may include a memory device 1100 and a memory controller 1200 capable of controlling an operation of the memory device 1100. The memory controller 1200 may control a data access operation of the memory device 1100, e.g., a program operation, an erase operation, a read operation, or the like under the control of a processor 3100.

Data programmed in the memory device 1100 may be output through a display 3200 under the control of the memory controller 1200.

A radio transceiver 3300 may transmit/receive radio signals through an antenna ANT. For example, the radio transceiver 3300 may convert a radio signal receive through the antenna ANT into a signal that can be processed by the processor 3100. Therefore, the processor 3100 may process a signal output from the radio transceiver 3300 and transmit the processed signal to the memory controller 1200 or the display 3200. The memory controller 1200 may program the signal processed by the processor 3100 in the semiconductor memory device 1100.

Also, the radio transceiver 3300 may convert a signal output from the processor 3100 into a radio signal, and output the converted radio signal to an external device through the antenna ANT. An input device 3400 is a device capable of inputting a control signal for controlling an operation of the processor 3100 or data to be processed by the processor 3100, and may be implemented as a pointing device such as a touch pad or a computer mount, a keypad, or a keyboard. The processor 3100 may control an operation of the display 3200 such that data output from the memory controller 1200, data output from the radio transceiver 3300, or data output from the input device 3400 can be output through the display 3200.

In some embodiments, the memory controller 1200 capable of controlling an operation of the memory device 1100 may be implemented as a part of the processor 3100, or be implemented as a chip separate from the processor 3100.

Figure 15:
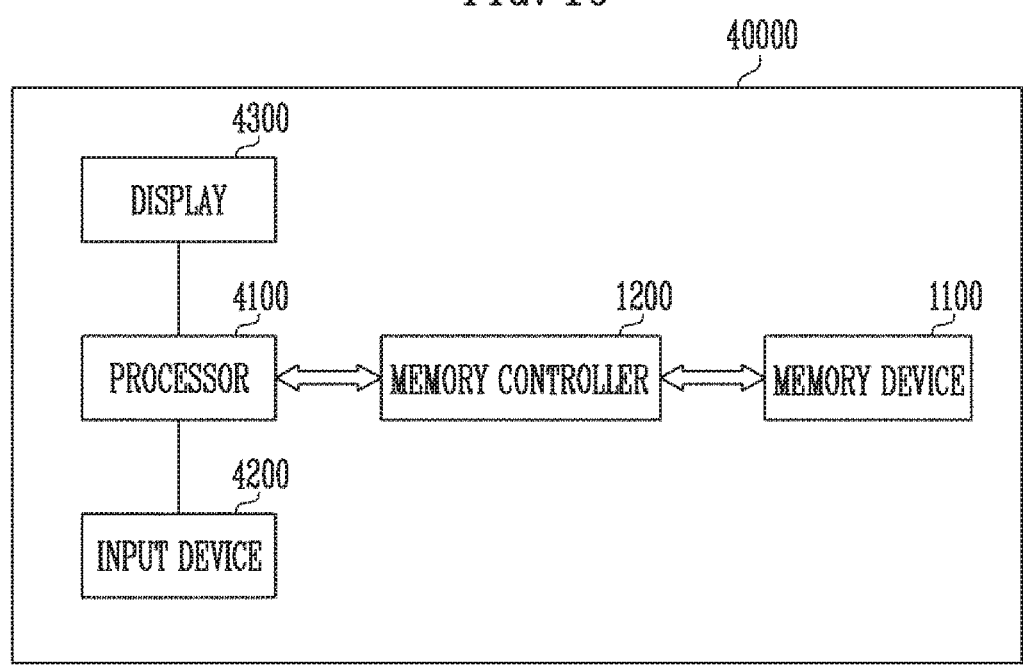
FIG. 15 is a diagram illustrating another embodiment of the memory system including the memory device shown in FIG. 2.

FIG. 15 is a diagram illustrating an application example of the memory system including the memory device shown in FIG. 2.

Referring to FIG. 15, the memory system 40000 may be implemented as a personal computer (PC), a tablet PC, a net-book, an e-reader, a personal digital assistant (PDA), a portable multimedia player (PMP), an MP3 player, or an MP4 player.

The memory system 40000 may include a memory device 1100 and a memory controller 1200 capable of controlling a data processing operation of the memory device 1100.

A processor 4100 may output data stored in the memory device 1100 through a display 4300 according to data input through an input device 4200. For example, the input device 4200 may be implemented as a pointing device such as a touch pad or a computer mouse, a keypad, or a keyboard.

The processor 4100 may control overall operations of the memory system 40000, and control an operation of the memory controller 1200. In some embodiments, the memory controller 1200 capable of controlling an operation of the memory device 1100 may be implemented as a part of the processor 4100, or be implemented as a chip separate from the processor 4100.

Figure 16:
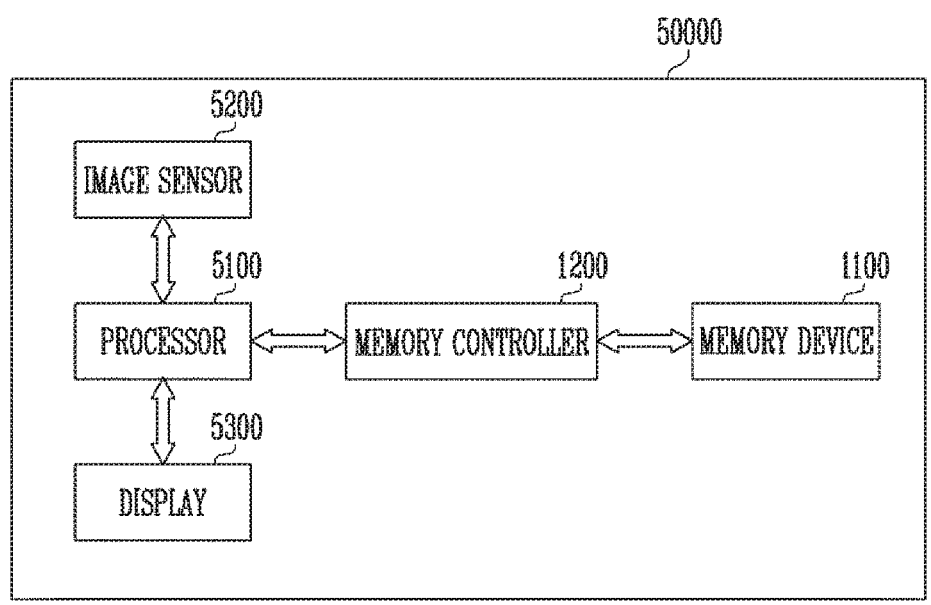
FIG. 16 is a diagram illustrating another embodiment of the memory system including the memory device shown in FIG. 2.

FIG. 16 is a diagram illustrating an application example of the memory system including the memory device shown in FIG. 2.

Referring to FIG. 16, the memory system 50000 may be implemented as an image processing device, e.g., a digital camera, a mobile terminal having a digital camera attached thereto, a smart phone having a digital camera attached thereto, or a tablet PC having a digital camera attached thereto.

The memory system 50000 may include a memory device 1100 and a memory controller 1200 capable of controlling a data processing operation of the memory device 1100, e.g., a program operation, an erase operation, or a read operation.

An image sensor 5200 of the memory system 50000 may convert an optical image into digital signals, and the converted digital signals may be transmitted to a processor 5100 or the memory controller 1200. Under the control of the processor 5100, the converted digital signals may be output through a display 5300, or be stored in the memory device 1100 through the memory controller 1200. In addition, data stored in the memory device 1100 may be output through the display 5300 under the control of the processor 5100 or the memory controller 1200.

In some embodiments, the memory controller 1200 capable of controlling an operation of the memory device 1100 may be implemented as a part of the processor 5100, or be implemented as a chip separate from the processor 5100.

Figure 17:
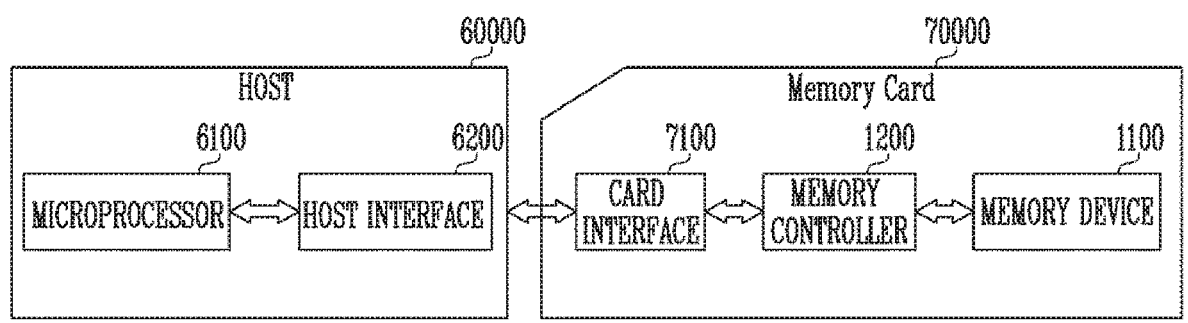
FIG. 17 is a diagram illustrating another embodiment of the memory system including the memory device shown in FIG. 2.

FIG. 17 is a diagram illustrating an application example of the memory system including the memory device shown in FIG. 2.

Referring to FIG. 17, the memory system 70000 may be implemented as a memory card or a smart card. The memory system 70000 may include a memory device 1100, a memory controller 1200, and a card interface 7100.

The memory controller 1200 may control data exchange between the memory device 1100 and the card interface 7100. In some embodiments, the card interface 7100 may be a secure digital (SD) card interface or a multi-media card (MMC) interface, but the present disclosure is not limited thereto.

The card interface 7100 may interface data exchange between a host 60000 and the memory controller 1200 according to a protocol of the host 60000. In some embodiments, the card interface 7100 may support a universal serial bus (USB) protocol and an inter-chip (IC)-USB protocol. Here, the card interface 7100 may mean hardware capable of supporting a protocol used by the host 60000, software embedded in the hardware, or a signal transmission scheme.

When the memory system 70000 is coupled to a host interface 6200 of the host 60000 such as a PC, a tablet PC, a digital camera, a digital audio player, a cellular phone, console video game hardware, or a digital set-top box, the host interface 6200 may perform data communication with the memory device 1100 through the card interface 7100 and the memory controller 1200 under the control of a microprocessor 6100.

According to the present disclosure, when a threshold voltage distribution of memory cells is extracted, a read operation is performed using a user read command and an offset voltage, so that a separate test read command is not required. Accordingly, the design overhead of the memory device can be decreased, and the time required to extract the threshold voltage distribution can be reduced.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A memory system comprising:
   a memory device configured to generate first read voltages and second read voltages, based on initial read voltages and first and second offset voltages, in response to a user read command, and output first data and second data, which are acquired by read operations on multi-bit memory cells, based on the first read voltages and the second read voltages; and
   a memory controller configured to output the user read command,
   wherein the memory controller includes a state counter configured to count numbers of data bits respectively corresponding to a plurality of threshold voltage states from the first data and the second data, and extract numbers of memory cells respectively included in a plurality of threshold voltage regions divided by the first read voltages and the second read voltages by calculating the counted result,
   wherein the plurality of threshold voltage states includes a first threshold voltage state and a second threshold voltage state,
   wherein the state counter extracts a number of memory cells included in a first region among the plurality of threshold voltage regions, based on a difference between a number of data bits corresponding to the first threshold voltage state, which is counted from the first data, and a number of data bits corresponding to the first threshold voltage state, which is counted from the second data, and wherein the state counter extracts a first addition result by adding a number of data bits corresponding to the first threshold voltage state and a number of data bits corresponding to the second threshold voltage state, which are counted from the first data, extracts a second addition result by adding a number of data bits corresponding to the first threshold voltage state and a number of data bits corresponding to the second threshold voltage state, which are counted from the second data, and extracts a number of memory cells included in a second region among the plurality of threshold voltage regions, based on a difference between the first addition result and the second addition result.

2. The memory system of claim 1, wherein a threshold voltage of the second region is larger than that of the first region.

3. The memory system of claim 1, wherein the read operations include a two-time most significant bit (MSB) read operation and a two-time least significant bit (LSB) read operation.

4. The memory system of claim 1,
wherein the read operations include MSB read operations and LSB read operations, and
wherein the first data is generated through one of the MSB read operations and one of the LSB read operations, which are performed based on the first read voltages.

5. The memory system of claim 4, wherein the MSB read operation is performed using two different voltages among the first read voltages, and one bit is generated from each of the multi-bit memory cells.

6. The memory system of claim 1,
wherein the memory device receives a read address from the memory controller,
wherein the user read command includes a preamble and a postamble, and
wherein the read address is input between the preamble and the postamble.

7. The memory system of claim 1, wherein the memory device receives a first offset voltage and a second offset voltage from the memory controller.

8. The memory system of claim 7, wherein the memory device receives the user read command after the first offset voltage is input.

9. The memory system of claim 1, wherein the first read voltages have voltage levels lower by the first offset voltage than those of the respective initial read voltages.

10. A memory system comprising:
a memory device; and
a memory controller,
wherein the memory device includes:
multi-bit memory cells;
an input/output circuit configured to receive a user read command from the memory controller;
a voltage generating circuit configured to generate first read voltages, based on initial read voltages and a first offset voltage, and generate second read voltages, based on the initial read voltages and a second offset voltage, in response to the user read command; and
a page buffer group configured to store first data acquired by a first MSB read operation and a first LSB read operation on the multi-bit memory cells, based on the first read voltages, and store second data acquired by a second MSB read operation and a second LSB read operation on the multi-bit memory cells, based on the second read voltages,
wherein the memory controller includes a state counter configured to derive a first addition result by adding number of data bits respectively corresponding to a plurality of threshold voltage states from the first data, derive a second addition result by adding number of data bits respectively corresponding to a plurality of threshold voltage states from the second data, and extract a number of memory cells included in any one of a plurality of threshold voltage regions divided by the first read voltages and the second read voltages, based on a result obtained by subtracting the second addition result from the first addition result.

11. The memory system of claim 10, wherein the first MSB read operation is performed using two different voltages among the first read voltages, and one bit is generated from each of the multi-bit memory cells.

12. The memory system of claim 10,
wherein the input/output circuit receives a read address from the memory controller,
wherein the user read command includes a preamble and a postamble, and
wherein the input/output circuit receives the read address between the preamble and the postamble.

13. A method for operating a memory system, the method comprising:
receiving a first user read command;
reading first data through read operations on a plurality of memory cells, using first read voltages, in response to the user read command;
receiving a second user read command and a first offset voltage;
reading second data through the read operations on the plurality of memory cells, using second read voltages generated based on the first read voltages and the first offset voltage, in response to the second user read command; and
extracting a number of memory cells included in a first region among a plurality of threshold voltage regions divided by the first read voltages and the second read voltages by subtracting a number of data bits corresponding a first threshold voltage state, which is extracted from the second data, from a number of data bits corresponding to the first threshold voltage state, which is extracted from the first data.

14. The method of claim 13, further comprising:
deriving a first addition result by adding a number of data bits corresponding to the first threshold voltage state and a number of data bits corresponding to a second threshold voltage state, which are extracted from the first data;
deriving a second addition result by adding a number of data bits corresponding to the first threshold voltage state and a number of data bits corresponding to the second threshold voltage state, which are extracted from the second data; and
extracting a number of memory cells included in a second region among the plurality of threshold voltage regions by subtracting the second addition result from the first addition result.

15. The method of claim 14, wherein a threshold voltage of the second region is larger than that of the first region.

16. The method of claim 15, wherein the read operation is performed using two different voltages among the first read voltages or the second read voltages, and one bit is extracted from each of the memory cells.

17. The method of claim 14,
further comprising receiving a read address,
wherein the user read command includes a preamble and a postamble, and wherein the read address is input between the preamble and the postamble.

18. The method of claim 15, wherein the receiving of the user read command includes:
   receiving the user read command for an MSB read operation; and
   receiving the user read command for an LSB read operation.

* * * * *